US011217601B2

(12) United States Patent
Luo et al.

(10) Patent No.: US 11,217,601 B2
(45) Date of Patent: Jan. 4, 2022

(54) MICROELECTRONIC DEVICES INCLUDING STAIRCASE STRUCTURES, AND RELATED MEMORY DEVICES AND ELECTRONIC SYSTEMS

(71) Applicant: Micron Technology, Inc., Boise, ID (US)

(72) Inventors: Shuangqiang Luo, Boise, ID (US); Xuan Li, Singapore (SG); Adeline Yii, Singapore (SG)

(73) Assignee: Micron Technology, Inc., Boise, ID (US)

( * ) Notice: Subject to any disclaimer, the term of this patent is extended or adjusted under 35 U.S.C. 154(b) by 53 days.

(21) Appl. No.: 16/667,704

(22) Filed: Oct. 29, 2019

(65) Prior Publication Data

US 2021/0126009 A1   Apr. 29, 2021

(51) Int. Cl.
| *H01L 21/00* | (2006.01) |
| *H01L 27/11582* | (2017.01) |
| *H01L 27/1157* | (2017.01) |
| *H01L 27/11556* | (2017.01) |
| *H01L 27/11519* | (2017.01) |
| *H01L 27/11524* | (2017.01) |
| *H01L 27/11565* | (2017.01) |

(52) U.S. Cl.
CPC .... *H01L 27/11582* (2013.01); *H01L 27/1157* (2013.01); *H01L 27/11519* (2013.01); *H01L 27/11524* (2013.01); *H01L 27/11556* (2013.01); *H01L 27/11565* (2013.01)

(58) Field of Classification Search
CPC .......... H01L 27/11582; H01L 27/1157; H01L 27/11556
See application file for complete search history.

(56) References Cited

U.S. PATENT DOCUMENTS

| 8,624,300 | B2 | 1/2014 | Tang et al. |
| 9,070,442 | B2 | 6/2015 | Yip et al. |
| 9,589,978 | B1 | 3/2017 | Yip |
| 9,786,375 | B2 | 10/2017 | Goda et al. |
| 9,853,046 | B2 | 12/2017 | Lu et al. |
| 9,881,929 | B1 * | 1/2018 | Ravikirthi ......... H01L 27/11556 |
| 9,905,575 | B2 | 2/2018 | Lee |

(Continued)

FOREIGN PATENT DOCUMENTS

WO   WO-2020081147 A1 *  4/2020  .......... H01L 27/1157

*Primary Examiner* — Laura M Menz
(74) *Attorney, Agent, or Firm* — TraskBritt

(57) ABSTRACT

A microelectronic device comprises a stack structure, at least one staircase structure, contact structures, and support structures. The stack structure comprises vertically alternating conductive structures and insulating structures arranged in tiers, each of the tiers individually comprising one of the conductive structures and one of the insulating structures. The at least one staircase structure is within the stack structure and has steps comprising edges of at least some of the tiers. The contact structures are on the steps of the at least one staircase structure. The support structures horizontally alternate with the contact structures in a first horizontal direction and vertically extend through the stack structure. The support structures have oblong horizontal cross-sectional shapes. Additional microelectronic devices, memory devices, and electronic systems are also described.

9 Claims, 6 Drawing Sheets

(56) References Cited

U.S. PATENT DOCUMENTS

| | | | |
|---|---|---|---|
| 9,941,209 B2 | 4/2018 | Tessariol et al. | |
| 10,074,430 B2 | 9/2018 | Sakui | |
| 10,090,318 B2 | 10/2018 | Zhu et al. | |
| 10,224,240 B1* | 3/2019 | Funayama | H01L 23/528 |
| 10,229,923 B2 | 3/2019 | Dorhout et al. | |
| 10,256,249 B2 | 4/2019 | Douhout et al. | |
| 10,263,007 B2 | 4/2019 | Dorhout et al. | |
| 10,269,625 B1* | 4/2019 | Matovu | H01L 23/5283 |
| 10,283,520 B2 | 5/2019 | Hopkins et al. | |
| 10,354,980 B1* | 7/2019 | Mushiga | H01L 27/11575 |
| 10,354,987 B1* | 7/2019 | Mushiga | H01L 21/76898 |
| 10,355,009 B1* | 7/2019 | Kai | H01L 21/76805 |
| 10,580,795 B1* | 3/2020 | Luo | H01L 23/53257 |
| 10,600,682 B2* | 3/2020 | Matovu | H01L 21/76819 |
| 10,600,802 B2* | 3/2020 | Nakamura | H01L 29/40117 |
| 10,879,267 B1* | 12/2020 | Luo | H01L 27/11526 |
| 2015/0162084 A1 | 6/2015 | Morooka et al. | |
| 2016/0104717 A1 | 4/2016 | Lu et al. | |
| 2017/0062337 A1* | 3/2017 | Park | H01L 21/76865 |
| 2017/0162592 A1* | 6/2017 | Nishikawa | H01L 28/20 |
| 2017/0236746 A1* | 8/2017 | Yu | H01L 27/11582 |
| | | | 257/314 |
| 2018/0374865 A1* | 12/2018 | Shimabukuro | H01L 29/66553 |
| 2019/0103406 A1 | 4/2019 | Tang et al. | |
| 2019/0280000 A1* | 9/2019 | Nakamura | H01L 29/7883 |
| 2021/0126009 A1* | 4/2021 | Luo | H01L 27/11556 |
| 2021/0126010 A1* | 4/2021 | Luo | H01L 27/11556 |

* cited by examiner

MICROELECTRONIC DEVICES INCLUDING STAIRCASE STRUCTURES, AND RELATED MEMORY DEVICES AND ELECTRONIC SYSTEMS

TECHNICAL FIELD

The disclosure, in various embodiments, relates generally to the field of microelectronic device design and fabrication. More specifically, the disclosure relates to microelectronic devices including staircase structures, and to related memory devices and electronic systems.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in one or more decks (e.g., stack structures) including tiers of conductive structures and dielectric materials. Each vertical memory string may include at least one select device coupled in series to a serial combination of vertically-stacked memory cells. Such a configuration permits a greater number of switching devices (e.g., transistors) to be located in a unit of die area (i.e., length and width of active surface consumed) by building the array upwards (e.g., vertically) on a die, as compared to structures with conventional planar (e.g., two-dimensional) arrangements of transistors.

Vertical memory array architectures generally include electrical connections between the conductive structures of the tiers of the deck(s) (e.g., stack structure(s)) of the memory device and access lines (e.g., word lines) so that the memory cells of the vertical memory array can be uniquely selected for writing, reading, or erasing operations. One method of forming such an electrical connection includes forming so-called "staircase" (or "stair step") structures at edges (e.g., horizontal ends) of the tiers of the deck(s) of the memory device. The staircase structure includes individual "steps" defining contact regions of the conductive structures, upon which conductive contact structures can be positioned to provide electrical access to the conductive structures.

As vertical memory array technology has advanced, enhanced memory density has been provided by forming memory devices to exhibit multiple deck (e.g., dual deck) configurations. For example, in one conventional dual deck configuration, some vertical memory strings are located in an upper deck (e.g., an upper stack structure), and additional vertical memory strings are located in a lower deck (e.g., a lower stack structure) underlying the upper deck. The vertical memory strings of the upper deck may be electrically coupled to the additional vertical memory strings of the lower deck (e.g., by way of conductive interconnect structures), or the vertical memory strings of the upper deck may be electrically isolated from the additional vertical memory strings of the lower deck (e.g., by way of an intervening dielectric material). Unfortunately, as feature packing densities have increased and margins for formation errors have decreased, conventional deck configurations have resulted in undesirable defects (e.g., word line thickness variations, word line bending, word line bowing, word line contact punch through) and current leaks (e.g., word line current leakage) that can diminish desired memory device performance, reliability, and durability.

Accordingly, there remains a need for new microelectronic device (e.g., memory device, such as 3D NAND Flash memory device) configurations facilitating enhanced memory density while alleviating the problems of conventional microelectronic device configurations, as well as for new electronic systems including the new microelectronic device configurations.

DETAILED DESCRIPTION

Figure 1:
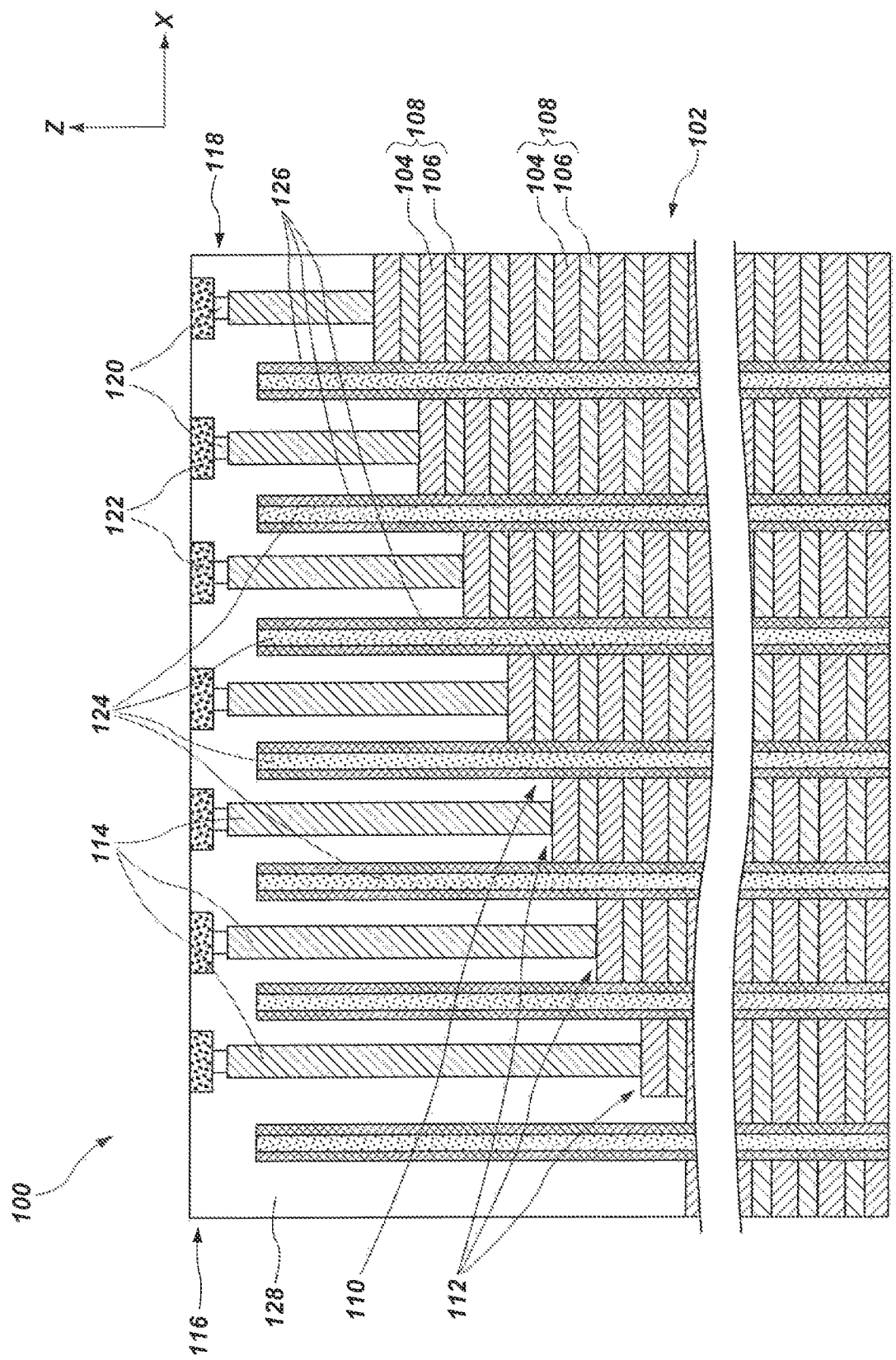
FIG. 1 is a simplified, partial cross-sectional view of a microelectronic device structure, in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device, such as 3D NAND Flash memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes a microelectronic device exhibiting, but not limited to, memory functionality.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure.

As used herein, features (e.g., regions, structures, devices) described as "neighboring" one another means and includes features of the disclosed identity (or identities) are located most proximate (e.g., closest to) one another. Additional features (e.g., additional regions, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "configured" refers to a size, shape, material composition, orientation, and arrangement of one or more of at least one structure and at least one apparatus facilitating operation of one or more of the structure and the apparatus in a pre-determined way.

As used herein, the phrase "coupled to" refers to structures operatively connected with each other, such as electrically connected through a direct Ohmic connection or through an indirect connection (e.g., by way of another structure).

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

FIG. 1 is a simplified, partial cross-sectional view of a microelectronic device structure 100 of a microelectronic device (e.g., a semiconductor device; a memory device, such as a 3D NAND Flash memory device), in accordance with embodiments of the disclosure. The microelectronic device structure 100 may, for example, comprise a portion of a memory device (e.g., a multi-deck 3D NAND Flash memory device, such as a dual deck 3D NAND Flash memory device).

As shown in FIG. 1, the microelectronic device structure 100 includes a stack structure 102 including a vertically alternating (e.g., in the Z-direction) sequence of conductive structures 104 (e.g., access line plates, word line plates) and insulating structures 106 arranged in tiers 108. Each of the tiers 108 of the stack structure 102 may include at least one (1) of the conductive structures 104 vertically neighboring at least one of the insulating structures 106. The stack structure 102 may include a desired quantity of the tiers 108. For example, the stack structure 102 may include greater than or equal to ten (10) of the tiers 108, greater than or equal to twenty-five (25) of the tiers 108, greater than or equal to fifty (50) of the tiers 108, greater than or equal to one hundred (100) of the tiers 108, greater than or equal to one hundred and fifty (150) of the tiers 108, or greater than or equal to two hundred (200) of the tiers 108 of the conductive structures 104 and the insulating structures 106.

The conductive structures 104 of the tiers 108 of the stack structure 102 may be formed of and include at least one electrically conductive material, such as a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pa), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductively-doped semiconductor material (e.g., conductively-doped polysilicon, conductively-doped germanium (Ge), conductively-doped silicon germanium (SiGe)), a conductive metal-containing material (e.g., a conductive metal nitride, a conductive metal silicide, a conductive metal carbide, a conductive metal oxide), or combinations thereof. In some embodiments, the conductive structures 104 are formed of and include W. Each of the conductive structures 104 may individually include a substantially homogeneous distribution of the at least one conductive material, or a substantially heterogeneous distribution of the at least one conductive material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the conductive structures 104 of each of the tiers 108 of the stack structure 102 exhibits a substantially homogeneous distribution of conductive material. In additional embodiments, at least one of the conductive structures 104 of at least one of the tiers 108 of the stack structure 102 exhibits a substantially heterogeneous distribution of at least one conductive material. The conductive structure 104 may, for example, be formed of and include a stack of at least two different conductive materials. The conductive structures 104 of each of the tiers 108 of the stack structure 102 may each be substantially planar, and may each exhibit a desired thickness (e.g., vertical height in the Z-direction).

The insulating structures 106 of the tiers 108 of the stack structure 102 may be formed of and include at least one dielectric material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x", "y", and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, the insulating structures 106 may comprise one or more stoichiometric compounds and/or one or more non-stoichiometric compounds, and values of "x", "y", and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In some embodiments, the insulating structures 106 are formed of and include $SiO_2$. Each of the insulating structures 106 may individually include a substantially homogeneous distribution of the at least one insulating material, or a substantially heterogeneous distribution of the at least one insulating material. In some embodiments, each of the insulating structures 106 of each of the tiers 108 of the stack structure 102 exhibits a substantially homogeneous distribution of insulating material. In additional embodiments, at least one of the insulating structures 106 of at least one of the tiers 108 of the stack structure 102 exhibits a substantially heterogeneous distribution of at least one insulating material. The insulating structure 106 may, for example, be formed of and include a stack (e.g., laminate) of at least two different insulating materials. The insulating structures 106 of each of the tiers 108 of the stack structure 102 may each be substantially planar, and may each individually exhibit a desired thickness.

At least one lower conductive structure 104 of the stack structure 102 may be employed as at least one lower select gate (e.g., at least one source side select gate (SGS)) of the microelectronic device structure 100. In some embodiments, a single (e.g., only one) conductive structure 104 of a vertically lowermost tier 108 of the stack structure 102 is employed as a lower select gate (e.g., a SGS) of the microelectronic device structure 100. In addition, upper conductive structure(s) 104 of the stack structure 102 may be employed as upper select gate(s) (e.g., drain side select gate(s) (SGDs)) of the microelectronic device structure 100. In some embodiments, horizontally neighboring conductive structures 104 of a vertically uppermost tier 108 of the stack structure 102 are employed as upper select gates (e.g., SGDs) of the microelectronic device structure 100.

With continued reference to FIG. 1, the microelectronic device structure 100 may further include at least one staircase structure 110 including steps 112 (e.g., contact regions) defined by edges of the tiers 108. The quantity of steps 112 included in the staircase structure 110 may be substantially the same as (e.g., equal to) or may be different than (e.g., less than, greater than) the quantity of tiers 108 in each the stack structure 102. As shown in FIG. 1, in some embodiments, the steps 112 of the staircase structure 110 are arranged in order, such that steps 112 directly horizontally adjacent one another in the X-direction correspond to tiers 108 of the stack structure 102 directly vertically adjacent (e.g., in the Z-direction) one another. In additional embodiments, the steps 112 of the staircase structure 110 are arranged out of order, such that at least some steps 112 of the staircase structure 110 directly horizontally adjacent one another in the X-direction correspond to tiers 108 of stack structure 102 not directly vertically adjacent (e.g., in the Z-direction) one another.

The microelectronic device structure 100 further includes contact structures 114 (e.g., access line contact structures, word line contact structures) physically and electrically contacting the steps 112 of the staircase structure 110 to provide electrical access to the conductive structures 104 of the stack structure 102. The contact structures 114 may be formed of and include at least one electrically conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). Each of the contact structures 114 may have substantially the same material composition, or at least one of the contact structures 114 may have a different material composition than at least one other of the contact structures 114.

The contact structures 114 may each individually exhibit a desired geometric configuration (e.g., dimensions and shape), a desired horizontal position (e.g., within the horizontal boundaries of the steps 112 of the stack structure 102), and desired horizontal spacing (e.g., relative to one another, relative to other components of the microelectronic device structure 100). As described in further detail below, the geometric configurations, horizontal positions, and horizontal spacing of the contact structures 114 may be selected at least partially based on the geometric configurations, horizontal positions, and horizontal spacing of other features (e.g., the steps 112 of the staircase structure 110, support structures) of the microelectronic device structure 100. For example, the contact structures 114 may each individually have a geometric configuration, horizontal position, and horizontal spacing complements the geometric configurations, horizontal positions, and horizontal spacing of the other features of the microelectronic device structure 100 so as to impede (e.g., substantially prevent) tier deformation (e.g., bending, warping, and/or bowing of the conductive structures 104 of the tiers 108) and/or tier damage (e.g., contact structure 114 punch through of conductive structures 104 of the tiers 108 at the steps 112 of the staircase structure 110) during and/or after the formation of the tiers 108 of the stack structure 102 (e.g., by way of "replace gate" or "gate last" processing acts). Each of the contact structures 114 may exhibit substantially the same geometric configuration (e.g., the same dimensions and the same shape), horizontal step position (e.g., horizontal position within the area of a step 112 associated therewith), and horizontal spacing as each other of the contact structures 114; or at least one of the contact structures 114 may exhibit a different geometric configuration (e.g., one or more different dimension(s), a different shape), a different horizontal step position, and/or different horizontal spacing than at least one other of the contact structures 114.

With continued reference to FIG. 1, the microelectronic device structure 100 may further include, a routing tier 116 (e.g., a metallization tier) vertically overlying (e.g., in the Z-direction) the contact structures 114, and a interconnect tier 118 between the contact structures 114 and the routing tier 116. The interconnect tier 118 and the routing tier 116 may be in electrical communication with the contact structures 114, and may electrically connect the contact structures 114 (and, hence, the conductive structures 104 of the tiers 108 of the stack structure 102 electrically coupled to the contact structures 114) to components of a microelectronic device (e.g., a memory device) including the microelectronic device structure 100, as described in further detail below. The interconnect tier 118 may include interconnect structures 120 (e.g., vertically extending conductive structures) contacting (e.g., physically contacting, electrically contacting) the contact structures 114, and the routing tier 116 may include pad structures 122 (e.g., horizontally extending conductive structures) contacting (e.g., physically contacting, electrically contacting) the interconnect structures 120. In some embodiments, the pad structures 122 are electrically connected to additional structures and/or devices (e.g., back end of line (BEOL) devices; control logic devices, such as CMOS devices) vertically underlying the microelectronic device structure 100.

The interconnect structures 120 and the pad structures 122 may each individually be formed of and include at least one electrically conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the interconnect structures 120 and the pad structures 122 have substantially the same material composition as one another (e.g., are each formed of and include the same electrically conductive material(s)). In additional embodiments, the interconnect structures 120 and the pad structures 122 have different material compositions than one another (e.g., are formed of and include different electrically conductive material(s) than one another).

With continued reference to FIG. 1, the microelectronic device structure 100 further includes support structures 124 (e.g., support pillars) horizontally between the contact structures 114, and vertically extending through the stack structure 102. Each of the support structures 124 may be formed of and include at least one electrically conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), a conductively-doped semiconductor material (e.g., conductively-doped Si, conductively-doped Ge, conductively-doped SiGe). In some embodiments, the support structures 124 have substantially the same material composition as one another (e.g., are each formed of and include the same electrically conductive material(s)). In addition, as shown in FIG. 1, at least one dielectric liner material 126 may substantially surround (e.g., substantially horizontally and vertically cover) sidewalls of each of the support structures 124. The dielectric liner material 126 may be horizontally interposed between each of the support structures 124 and the tiers 108 (including the conductive structures 104 and the insulating structure 106 thereof) of the stack structure 102. The dielectric liner material 126 may be formed of and include one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), at least one dielectric carboxynitride material (e.g., $SiO_xC_zN_y$), and amorphous carbon. In some embodiments, the dielectric liner material 126 comprises $SiO_2$.

The support structures 124 may serve as support features during and/or after the formation of the conductive structures 104 of the tiers 108 of the stack structure 102 using so called "replace gate" or "gate last" processing acts. During replace gate processing, a preliminary stack structure including a vertically alternating (e.g., in the Z-direction) sequence of the insulating structures 106 and sacrificial structures (e.g., additional insulating structures selectively etchable relative to the insulating structures 106, such as dielectric nitride structures if the insulating structures 106 comprise dielectric oxide structures) may be subjected to a material removal process to selectively remove (e.g., selectively exhume) at least a portion (e.g., all, less than all) of each the sacrificial structures relative to the insulating structures 106. Thereafter, open volumes (e.g., void spaces) formed by the removed portions of the sacrificial structures may be filled with a conductive material to form the conductive structures 104. The support structures 124 may impede (e.g., prevent) tier deformation (e.g., bending, warping, bowing) and/or tier damage (e.g., undesirable tier punch through) during and/or after the selective removal of the sacrificial structures.

The support structures 124 may individually be horizontally interposed between horizontally neighboring contact structures 114, and may individually vertically extend through the tiers 108 of the stack structure 102 at or horizontally proximate the steps 112 of the staircase structure 110 to one or more structures of one or more tiers (e.g., a source tier) vertically underlying the stack structure 102. As shown in FIG. 1, in some embodiments, the support structures 124 horizontally alternate with the contact structures 114 in a first horizontal direction (e.g., the X-direction). The support structures 124 may be located within horizontal boundaries of the staircase structure 110, and, optionally, may also be located outside the horizontal boundaries of the staircase structure 110 (e.g., some of the support structures 124 may be located outside of but proximate to the horizontal boundaries of the staircase structure 110).

The support structures 124 may each individually exhibit a desired geometric configuration (e.g., dimensions and shape), a desired horizontal position (e.g., within the horizontal boundaries staircase structure 110 of the stack structure 102), and desired horizontal spacing (e.g., relative to one another, relative the contact structures 114, relative to other components of the microelectronic device structure 100). As described in further detail below, the geometric configurations, horizontal positions, and horizontal spacing of the support structures 124 may be selected at least partially based on the geometric configurations, horizontal positions, and horizontal spacing of other components (e.g., the steps 112 of the staircase structure 110, the contact structures 114) of the microelectronic device structure 100. For example, the support structures 124 may each individually have a geometric configuration, horizontal position, and horizontal spacing permitting the support structure 124 to vertically extend (e.g., in the Z-direction) through the stack structure 102 and impede (e.g., substantially prevent) tier deformation (e.g., bending, warping, and/or bowing of the conductive structures 104 of the tiers 108) and/or tier damage (e.g., contact structure 114 punch through of conductive structures 104 of the tiers 108 at the steps 112 of the staircase structure 110) during and/or after the formation of the tiers 108 of the stack structure 102 (e.g., by way of "replace gate" or "gate last" processing acts). Each of the support structures 124 may exhibit substantially the same geometric configuration (e.g., the same dimensions and the same shape), horizontal step position (e.g., horizontal position within the area of one or more steps 112 associated therewith), and horizontal spacing as each other of the support structures 124; or at least one of the support structures 124 may exhibit a different geometric configuration (e.g., one or more different dimension(s), a different shape), a different horizontal step position, and/or different horizontal spacing than at least some other of the support structures 124.

With continued reference to FIG. 1, the microelectronic device structure 100 may further include an isolation material 128 on or over the stack structure 202. The isolation material 128 may cover the staircase structure 110 of the stack structure 102, and may surround surfaces of the contact structures 114, the interconnect structures 120, the pad structures 122, the support structures 124, and the dielectric liner material 126. The isolation material 128 may exhibit a substantially non-planar lower vertical boundary complementary to the topography of at least the stack structure 202 (including the staircase structure 110 thereof) thereunder.

The isolation material 128 may be formed of and include at least one dielectric material, such as one or more of at least one dielectric oxide material (e.g., one or more of $SiO_x$, phosphosilicate glass, borosilicate glass, borophosphosilicate glass, fluorosilicate glass, $AlO_x$, $HfO_x$, $NbO_x$, $TiO_x$, $ZrO_x$, $TaO_x$, and $MgO_x$), at least one dielectric nitride material (e.g., $SiN_y$), at least one dielectric oxynitride material (e.g., $SiO_xN_y$), and at least one dielectric carboxynitride material (e.g., $SiO_xC_zN_y$). The isolation material 128 may include a substantially homogeneous distribution or a substantially heterogeneous distribution of the at least one dielectric material. In some embodiments, the isolation material 128 exhibits a substantially homogeneous distribution of dielectric material. In further embodiments, the isolation material 128 exhibits a substantially heterogeneous distribution of at least one dielectric material. The isolation material 128 may, for example, be formed of and include a stack (e.g., laminate) of at least two different dielectric materials. In some embodiments, the isolation material 128 is formed of and includes $SiO_2$.

As previously described, the microelectronic device structure 100 may be formed to exhibit different configurations of at least the contact structures 114 and the support structures 124 thereof that impede (e.g., substantially prevent) tier deformation and/or tier damage during and/or after the formation of the tiers 108 of the stack structure 102 (e.g., by way of "replace gate" or "gate last" processing acts). By way of non-limiting example, FIGS. 2A through 4B are simplified top-down (FIGS. 2A, 3A, and 4A) and partial cross-sectional (FIGS. 2B, 3B, and 4B) views of different microelectronic device structure configurations, in accordance with embodiments of the disclosure. The microelectronic device structures described below with reference to FIGS. 2A through 4B may each individually exhibit features (e.g., structures, materials, regions) substantially similar to the previously-described features (e.g., the stack structure 102, including the tiers 108 of the conductive structures 104 and the insulative structures 106; the staircase structure 110, including the steps 112; the contact structures 114; the support structures 124; the dielectric liner material 126; the interconnect structures 120; the pad structures 122; the isolation material 128) of the microelectronic device structure 100. However, the microelectronic device structures described below with reference to FIGS. 2A through 4B may exhibit different horizontal configurations (e.g., different horizontal shapes, different horizontal sizes, different horizontal positions) of contact structures and support structures thereof that may be employed to impede tier deformation and/or tier damage during and/or after the formation of tiers (corresponding and substantially similar to the tiers 108 (FIG. 1)) thereof. Throughout FIGS. 2A through 4B and the associated description below, features (e.g., structures, materials, regions) functionally similar to features of the microelectronic device structure 100 (FIG. 1) are referred to with similar reference numerals incremented by 100. Not all features previously described with reference FIG. 1 are shown in FIGS. 2A through 4B. However, unless described otherwise below, it will be understood that features (and feature configurations) included in the microelectronic device structure 100 previously described with reference to FIG. 1 are also included in the microelectronic device structures described below with reference to FIGS. 2A through 4B. In addition, to avoid repetition, not all features shown in FIGS. 2A through 4B are described in detail herein. Rather, unless described otherwise below, in FIGS. 2A through 4B, a feature designated by a reference numeral that is a 100 increment of the reference numeral of a previously described feature (whether the previously described feature is first described before the present paragraph, or is first described after the present paragraph) will be understood to be substantially similar to the previously-described feature.

Figure 2B:
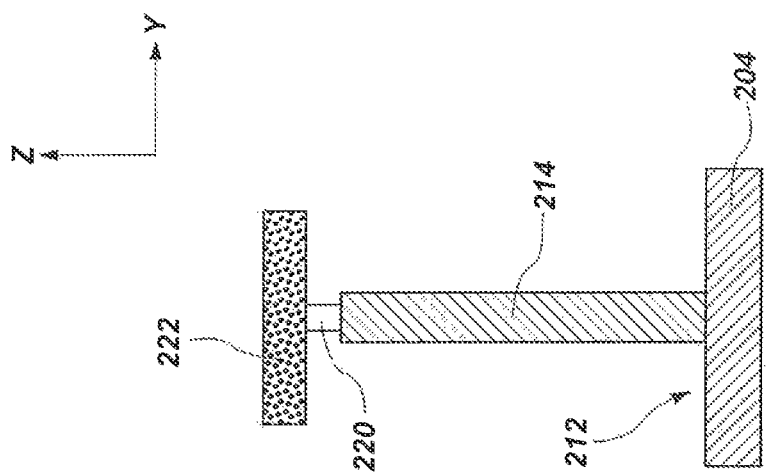
FIG. 2B is a simplified, partial cross-sectional view of the microelectronic device structure shown in FIG. 2A about the line $A_1$-$A_1$ depicted in FIG. 2A.
Figure 2A:
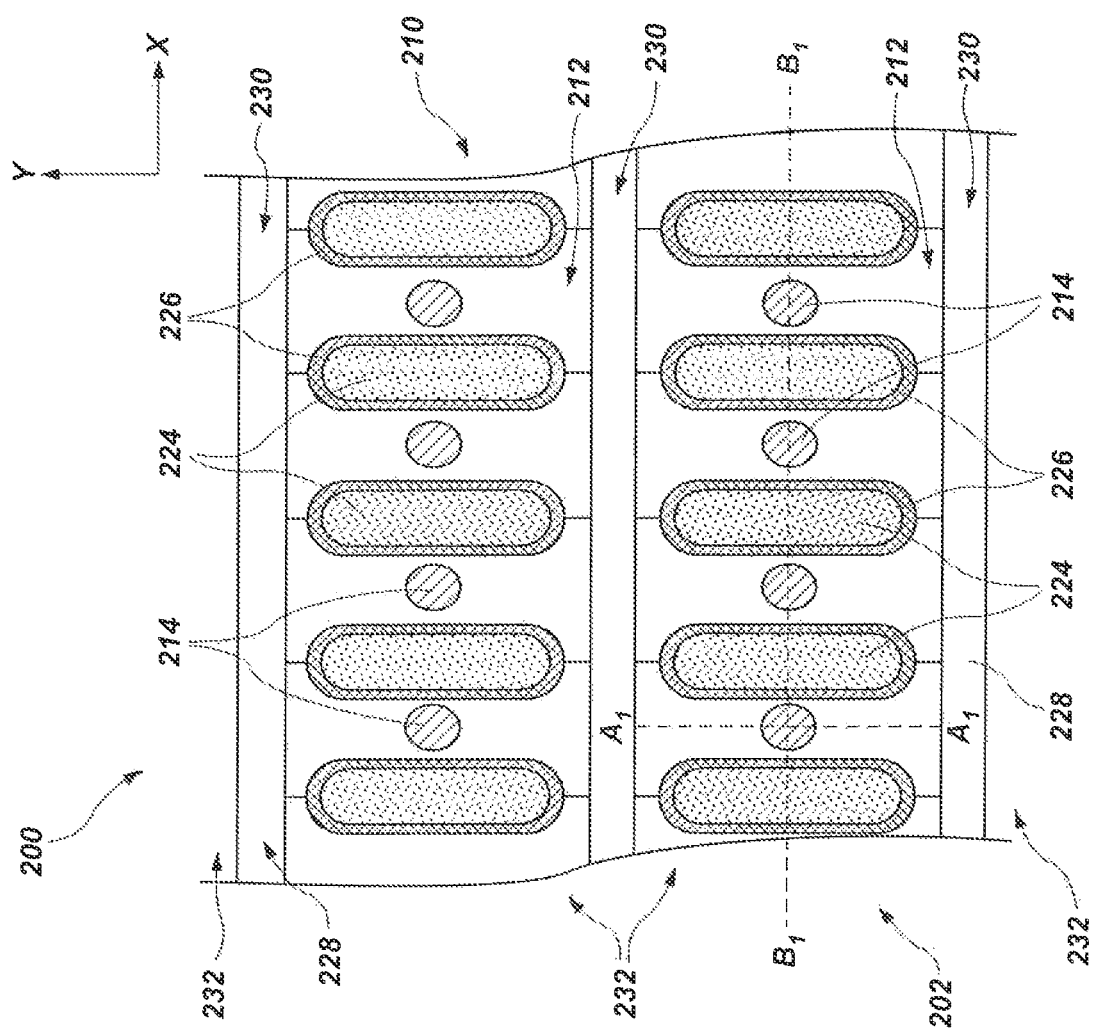
FIG. 2A is a simplified, partial top-down view of a microelectronic device structure, in accordance with embodiments of the disclosure.

FIG. 2A is a partial, top-down view of a microelectronic device structure 200, in accordance with an embodiment of the disclosure. FIG. 2B is a simplified, partial cross-sectional view of a portion of the microelectronic device structure 200 shown in FIG. 2A about the line $A_1$-$A_1$ depicted in FIG. 2A. For clarity and ease of understanding of the drawings and related description, not all features (e.g., structures, materials, regions) of the microelectronic device structure 200 depicted in one of FIGS. 2A and 2B are depicted the other of FIGS. 2A and 2B. For example, some features of the microelectronic device structure 200 vertically overlying or vertically underlying other features of the microelectronic device structure 200 are not shown in each of FIGS. 2A and 2B so as to provide a clearer view of the other features.

Referring to FIG. 2A, a stack structure 202 (corresponding to the stack structure 102 (FIG. 1)) of the microelectronic device structure 200 may be partitioned by slots 230. The slots 230 may extend in parallel in a first horizontal direction (e.g., the X-direction), and may partition (e.g., divide) the stack structure 202 in a second horizontal direction (e.g., the Y-direction) orthogonal to the first horizontal direction into multiple blocks 232. The slots 230 may vertically extend substantially completely through the stack structure 202. The slots 230 may, for example, be employed to form the conductive structures 204 (FIG. 2B) (corresponding to the conductive structures 104 (FIG. 1)) of the stack structure 202 through so-called "replace gate" or "gate last" processing acts. As shown in FIG. 2A, the slots 230 may be filled with isolation material 228.

The contact structures 214 may each individually be provided at a desired horizontal location (e.g., in the X-direction and the Y-direction) on or over one of the steps 212 of the microelectronic device structure 200. As shown in FIG. 2A, in some embodiments, each contact structure 214 is individually substantially horizontally centered on one of the steps 212 of the microelectronic device structure 200. For example, for each block 232 of the microelectronic device structure 200, the contact structures 214 associated with (e.g., within horizontal boundaries of) the block 232 may be substantially horizontally centered in the X-direction and the Y-direction on the steps 212 of the staircase structure 210 of the block 232. In additional embodiments, one or more of the contact structures 214 are individually horizontally offset (e.g., in the X-direction and/or in the Y-direction) from a horizontal center of the step 212 associated therewith. For example, for one or more of the blocks 232 of the microelectronic device structure 200, at least one (e.g., all, less than all) of the contact structures 214 associated with the block 232 may be horizontally offset in the Y-direction from a horizontal center of the step 212 on which the contact structure 214 is located. As another example, for one or more of the blocks 232 of the microelectronic device structure 200, at least one (e.g., all, less than all) of the contact structures 214 associated with the block 232 may be horizontally offset in the X-direction from a horizontal center of the step 212 on which the contact structure 214 is located.

The contact structures 214 may each individually exhibit a desired horizontal cross-sectional shape. As shown in FIG. 2A, in some embodiments, each of the contact structures 214 exhibits a substantially circular horizontal cross-sectional shape. In additional embodiments, one or more (e.g., each) of the contact structures 214 exhibits a non-circular cross-sectional shape, such as one more of an oblong cross-sectional shape, an elliptical cross-sectional shape, a square cross-sectional shape, a rectangular cross-sectional shape, a tear drop cross-sectional shape, a semicircular cross-sectional shape, a tombstone cross-sectional shape, a crescent cross-sectional shape, a triangular cross-sectional shape, a kite cross-sectional shape, and an irregular cross-sectional shape. In addition, each of the contact structures 214 may exhibit substantially the same horizontal cross-sectional dimensions (e.g., substantially the same horizontal diameter), or at least one of the contact structures 214 may exhibit one or more different horizontal cross-sectional dimensions (e.g., a different horizontal diameter) than at least one other of the contact structures 214. In some embodiments, all of the contact structures 214 exhibit substantially the same horizontal cross-sectional dimensions.

With continued reference to FIG. 2A, some of the contact structures 214 on the steps 212 of the stack structure 202 of the microelectronic device structure 200 may be horizontally aligned with one another. For example, at least some (e.g., all) contact structures 214 horizontally neighboring one another (e.g., in the X-direction) within horizontal boundaries of an individual (e.g., single) block 232 of the microelectronic device structure 200 (and, hence, on steps 212 at different vertical positions than one another within the block 232 of the microelectronic device structure 200) may be substantially aligned with one another (e.g., in the Y-direction). In some embodiments, horizontal centers of all contact structures 214 associated with (e.g., within horizontal boundaries of) the same block 232 as one another are substantially aligned with one another in the Y-direction, as depicted by the phantom line $B_1$-$B_1$ horizontally extending in the X-direction in FIG. 2A. In additional embodiments, horizontal centers of at least some (e.g., all) contact structures 214 associated with (e.g., within horizontal boundaries of) the same block 232 as one another are offset from (e.g., unaligned with) one another in the Y-direction. As another example, at least some (e.g., all, less than all) contact structures 214 horizontally neighboring one another in the Y-direction (and, hence, on steps 212 at substantially the same vertical position as one another within different blocks 232 of the microelectronic device structure 200) may be substantially aligned with one another in the X-direction. In addition, referring to FIG. 2B, the contact structures 214 may each individually be substantially horizontally centered in the Y-direction about horizontal centers of the interconnect structure 220 and the pad structure 222 operatively associated therewith (e.g., electrically connected thereto). In additional embodiments, a horizontal center of one or more (e.g., each) of the contact structures 214 may be horizontally offset in the Y-direction from a horizontal center of one or more of the interconnect structure 220 and the pad structure 222 operatively associated therewith (e.g., electrically connected thereto).

With returned reference to FIG. 2A, the support structures 224 may each individually be provided at a desired horizontal location (e.g., in the X-direction and the Y-direction) relative to the contact structures 214. Support structures 224 associated with (e.g., within horizontal boundaries of) an individual block 232 of the microelectronic device structure 200 may horizontally alternate with and be spaced apart from the contact structures 214 associated with the block 232 in the X-direction. In some embodiments, for each block 232 of the microelectronic device structure 200, each support structure 224 associated with the block 232 is substantially horizontally centered in the X-direction about adjacent boundaries of horizontally neighboring steps 212; and is substantially horizontally centered in the Y-direction about a horizontal centerline of the steps 212 of the block 232. In additional embodiments, for one or more blocks 232 of the microelectronic device structure 200, at least one support structure 224 associated with the block 232 is horizontally offset in the X-direction from adjacent boundaries of horizontally neighboring steps 212. For example, a majority (e.g., greater than 50 percent, such as greater than or equal 60 percent, greater than or equal to 70 percent, or greater than or equal to 80 percent) of the support structure 224 may be located within horizontal boundaries of one of the horizontally neighboring steps 212, and a minority (e.g., less than 50 percent, such as less than or equal to 40 percent, less than or equal to 30 percent, or less than or equal to 20 percent) of the support structure 224 may be located within horizontal boundaries of the other of the horizontally neighboring steps 212. In further embodiments, for one or more blocks 232 of the microelectronic device structure 200, a horizontal center of at least one support structure 224 associated with the block 232 is horizontally offset in the Y-direction from the horizontal centerline of the steps 212 of the block 232. For example, the support structure 224 may be located more proximate one slot 230 horizontally neighboring a first side of the block 232 than another slot 230 horizontally neighboring a second, opposing side of the block 232.

As shown in FIG. 2A, the support structures 224 may each individually exhibit an oblong horizontal cross-sectional shape. The oblong horizontal cross-section shape may, for example, include two (2) generally semicircular regions, and a generally rectangular region horizontally extending between the two (2) generally semicircular regions. In additional embodiments, one or more of the support structures 224 exhibits a different oblong horizontal cross-sectional shape (e.g., an ovular horizontal cross-sectional shape, a rectangular horizontal cross-sectional shape, a tombstone horizontal cross-sectional shape, a kite cross-sectional shape, an irregular cross-sectional shape). A horizontal dimension (e.g., width) of the support structures 224 in a first horizontal direction (e.g., the X-direction) may be less than another horizontal dimension (e.g., length) of the support structures 224 is a second horizontal dimension (e.g., the Y-direction). For example, between horizontally neighboring contact structures 214 associated with (e.g., within horizontal boundaries of) an individual block 232 of the microelectronic device structure 200, a single (e.g., only one) support structure 224 may horizontally extend in the Y-direction across a majority (e.g., greater than 50 percent, such as greater than or equal 60 percent, greater than or equal to 70 percent, or greater than or equal to 80 percent) of the horizontal dimension (e.g., length) in the Y-direction of horizontally neighboring steps 212 contacting the horizontally neighboring contact structures 214. Each of the support structures 224 may exhibit substantially the same horizontal cross-sectional dimensions (e.g., substantially the same width in the X-direction, substantially the same length in the Y-direction), or at least one of the support structures 224 may exhibit one or more different horizontal cross-sectional dimensions (e.g., a different width in the X-direction, a different length in the Y-direction) than at least one other of the support structures 224. In some embodiments, all of the support structures 224 exhibit substantially the same horizontal cross-sectional dimensions.

With continued reference to FIG. 2A, some of the support structures 224 of the microelectronic device structure 200 may be horizontally aligned with one another. For example, at least some (e.g., all) support structures 224 horizontally neighboring one another (e.g., in the X-direction) within horizontal boundaries of an individual (e.g., single) block 232 of the microelectronic device structure 200 may be substantially aligned with one another (e.g., in the Y-direction). In some embodiments, horizontal centers of all support structures 224 associated with (e.g., within horizontal boundaries of) the same block 232 as one another are substantially aligned with one another in the Y-direction, as depicted by the phantom line $B_1$-$B_1$ horizontally extending in the X-direction in FIG. 2A. As shown in FIG. 2A, in some embodiments, the support structures 224 associated with the same block 232 as one another are also substantially aligned (e.g., in the Y-direction) with the contact structures 214 associated with block 232. In additional embodiments, horizontal centers of at least some (e.g., all) contact structures 214 associated with (e.g., within horizontal boundaries of) the same block 232 as one another are offset from (e.g., unaligned with) one another in the Y-direction and/or are offset from horizontal centers of at least some contact structures 214 in the Y-direction. As another example, at least some (e.g., all, less than all) support structures 224 horizontally neighboring one another in the Y-direction (and, hence, within different blocks 232 of the microelectronic device structure 200 than one another) may be substantially aligned with one another in the X-direction.

Figure 3B:
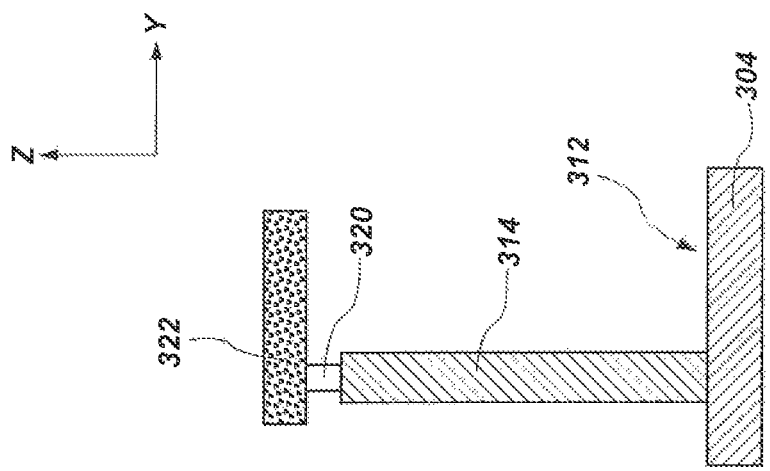
FIG. 3B is a simplified, partial cross-sectional view of the microelectronic device structure shown in FIG. 3A about the line $A_2$-$A_2$ depicted in FIG. 3A.
Figure 3A:
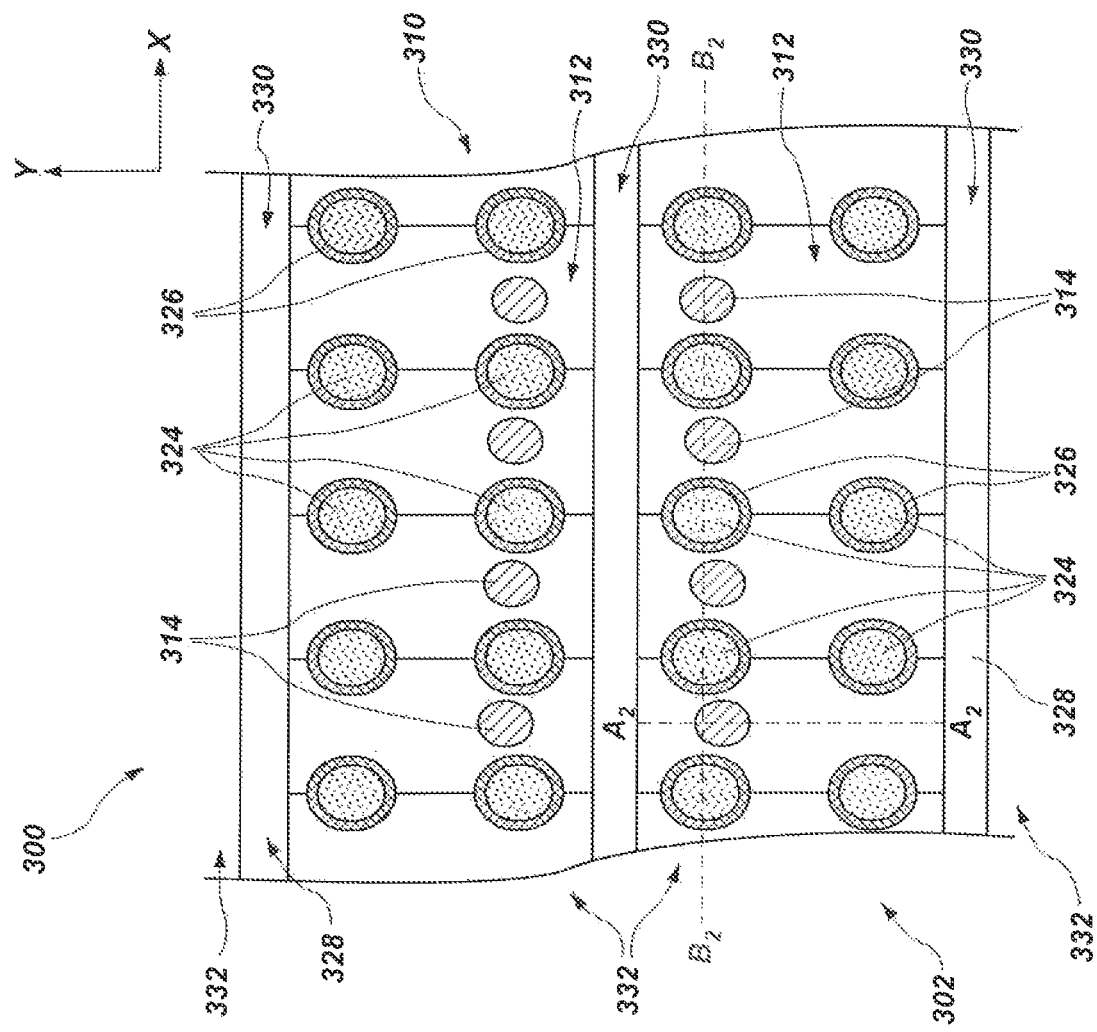
FIG. 3A is a simplified, partial top-down view of a microelectronic device structure, in accordance with additional embodiments of the disclosure.

FIG. 3A is a partial, top-down view of a microelectronic device structure 300, in accordance with an embodiment of the disclosure. FIG. 3B is a simplified, partial cross-sectional view of a portion of the microelectronic device structure 300 shown in FIG. 3A about the line $A_2$-$A_2$ depicted in FIG. 3A. For clarity and ease of understanding of the drawings and related description, not all features (e.g., structures, materials, regions) of the microelectronic device structure 300 depicted in one of FIGS. 3A and 3B are depicted the other of FIGS. 3A and 3B. For example, some features of the microelectronic device structure 300 vertically overlying or vertically underlying other features of the microelectronic device structure 300 are not shown in each of FIGS. 3A and 3B so as to provide a clearer view of the other features.

The contact structures 314 may each individually be provided at a desired horizontal location (e.g., in the X-direction and the Y-direction) on or over one of the steps 312 of the microelectronic device structure 300. As shown in FIG. 3A, for one or more (e.g., each) of the blocks 332 of the microelectronic device structure 300, horizontal positions in the Y-direction of at least some (e.g., each) of the contact structures 314 associated with (e.g., within horizontal boundaries of) the block 332 may be different than horizontal positions in the Y-direction of at least some (e.g., each) other of the contact structures 314 associated with the block 332. For example, the contact structures 314 associated with an individual (e.g., single) block 332 may progressively shift from horizontal positions relatively more proximate an individual slot 330 horizontally neighboring the block 332 to other horizontal positions relatively more distal from the individual slot 330 (e.g., other horizontal positions reality more proximate horizontal centers in the Y-direction of the steps 312 of the block 332). In some embodiments, contact structures 314 contacting relatively vertically higher steps 312 of an individual block 332 are positioned relatively horizontally closer to an individual slot 330 horizontally neighboring the block 332 than are contact structures 314 contacting relatively vertically lower steps 312 of the block 332. Each contact structure 314 associated with an individual block 332 of the microelectronic device structure 300 may have a different horizontal position in the Y-direction than each other contact structure 314 associated with the individual block 332, or at least one (but less than all) contact structure 314 associated with the individual block 332 may have substantially the same horizontal position in the Y-direction as at least one (but less than all) other contact structure 314 associated with the individual block 332. In addition, for one or more (e.g., each) of the blocks 332 of the microelectronic device structure 300, the contact structures 314 associated with the block 332 may be substantially horizontally centered in the X-direction on the steps 312 of the block 332. In additional embodiments, for one or more (e.g., each) of the blocks 332 of the microelectronic device structure 300, at least one (e.g., all, less than all) of the contact structures 314 associated with the block 332 is horizontally offset in the X-direction from a horizontal center of the step 312 on which the contact structure 314 is located.

The contact structures 314 may each individually exhibit a desired horizontal cross-sectional shape and desired horizontal cross-sectional dimensions. The horizontal cross-sectional shapes and horizontal cross-sectional dimensions of the contact structures 314 may be substantially similar to the horizontal cross-sectional shapes and the horizontal cross-sectional dimensions of the contact structures 214 previously described with reference to FIG. 2A.

With continued reference to FIG. 3A, at least some (e.g., all) contact structures 314 associated with an individual (e.g., single) block 332 of the microelectronic device structure 300 may be horizontally offset from one another in the Y-direction. For example, horizontal centers of contact structures 314 horizontally neighboring one another in the X-direction within horizontal boundaries of the block 332 (and, hence, on steps 312 at different vertical positions than one another within the block 332) may be offset from one another in the Y-direction, as depicted by the phantom line $B_2$-$B_2$ horizontally extending in the X-direction in FIG. 3A. In additional embodiments, horizontal centers of at least some (but less than all) contact structures 314 associated with the same block 332 as one another are substantially aligned with one another in the Y-direction. As shown in FIG. 3A, at least one support structure 324 associated with an individual block 332 is substantially aligned in the Y-direction with at least two horizontally neighboring (e.g., in the X-direction) contact structures 314 associated with block 332. In addition, at least some (e.g., all, less than all) contact structures 314 horizontally neighboring one another in the Y-direction (and, hence, on steps 312 at substantially the same vertical position as one another within different blocks 332 of the microelectronic device structure 300) may be substantially aligned with one another in the X-direction. In addition, referring to FIG. 3B, a horizontal center of one or more (e.g., each) of the contact structures 314 may be horizontally offset in the Y-direction from a horizontal center of one or more of the interconnect structure 320 and the pad structure 322 operatively associated therewith (e.g., electrically connected thereto). In some embodiments, the horizontal dimensions (e.g., lengths) of the pad structures 322 are elongated in the Y-direction relative to the horizontal dimensions (e.g., lengths) of the pad structures 222 (FIG. 2B) in the Y-direction to accommodate the horizontal positions in the Y-direction of the contact structures 314.

With returned reference to FIG. 3A, the support structures 324 may each individually be provided at a desired horizontal location (e.g., in the X-direction and the Y-direction) relative to the contact structures 314. As shown in FIG. 3A, individual blocks 332 of the microelectronic device structure 300 may include pairs of the support structures 324 horizontally neighboring one another in the Y-direction. The pairs of support structures 324 may horizontally alternate with and be spaced apart from the contact structures 314 associated with the block 232 in the X-direction. In some embodiments, for each individual block 332 of the microelectronic device structure 300, support structures 324 horizontally neighboring one another in the Y-direction are substantially horizontally centered in the X-direction about adjacent boundaries of horizontally neighboring steps 312. In additional embodiments, for one or more blocks 332 of the microelectronic device structure 300, at least some support structures 324 horizontally neighboring one another in the Y-direction are horizontally offset in the X-direction from adjacent boundaries of horizontally neighboring steps 312. For example, majorities (e.g., greater than 50 percent, such as greater than or equal 60 percent, greater than or equal to 70 percent, or greater than or equal to 80 percent) of the support structures 324 may be located within horizontal boundaries of one of the horizontally neighboring steps 312, and minorities (e.g., less than 50 percent, such as less than or equal to 40 percent, less than or equal to 30 percent, or less than or equal to 20 percent) of the support structures 324 may be located within horizontal boundaries of the other of the horizontally neighboring steps 312. As shown in FIG. 3A, for individual blocks 332 of the microelectronic device structure 300, horizontal centers of support structures 324 associated with the block 332 are horizontally offset in the Y-direction from a horizontal centerline of the steps 312 of the block 332.

The support structures 324 may each individually exhibit a desired horizontal cross-sectional shape. As shown in FIG. 3A, in some embodiments, each of the support structures 324 exhibits a substantially circular horizontal cross-sectional shape. In additional embodiments, one or more (e.g., each) of the support structures 324 exhibits a non-circular cross-sectional shape, such as one more of an oblong cross-sectional shape, an elliptical cross-sectional shape, a square cross-sectional shape, a rectangular cross-sectional shape, a tear drop cross-sectional shape, a semicircular cross-sectional shape, a tombstone cross-sectional shape, a crescent cross-sectional shape, a triangular cross-sectional shape, a kite cross-sectional shape, and an irregular cross-sectional shape. In addition, each of the support structures 324 may exhibit substantially the same horizontal cross-sectional dimensions (e.g., substantially the same horizontal diameter), or at least one of the support structures 324 may exhibit one or more different horizontal cross-sectional dimensions (e.g., a different horizontal diameter) than at least one other of the support structures 324. In some embodiments, all of the support structures 324 exhibit substantially the same horizontal cross-sectional dimensions.

With continued reference to FIG. 3A, some of the support structures 324 of the microelectronic device structure 300 may be horizontally aligned with one another. For example, at least some (e.g., all) support structures 324 horizontally neighboring one another in the Y-direction within horizontal boundaries of an individual block 332 of the microelectronic device structure 200 may be substantially aligned with one another in the X-direction. As another example, at least some (e.g., all) support structures 324 horizontally neighboring one another in the X-direction within horizontal boundaries of an individual block 332 of the microelectronic device structure 300 may be substantially aligned with one another in the Y-direction. In addition, at least some (e.g., all, less than all) support structures 324 horizontally neighboring one another in the Y-direction and within different blocks 332 of the microelectronic device structure 300 than one another may be substantially aligned with one another in the X-direction.

Figure 4B:
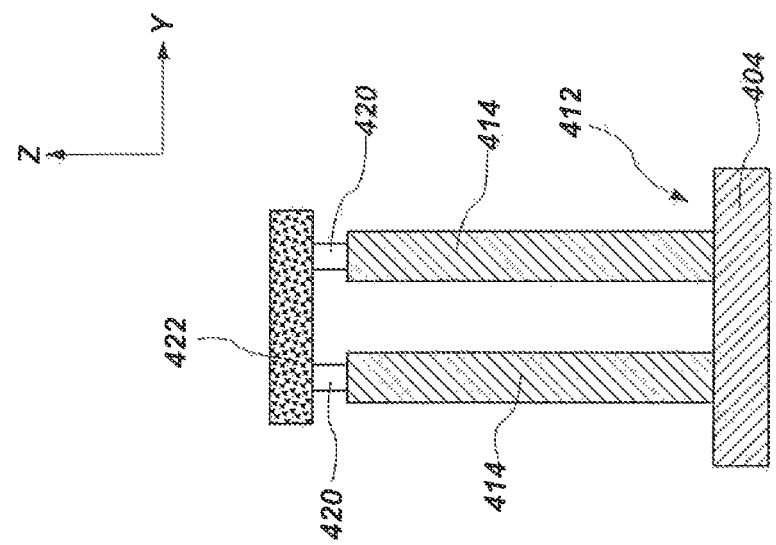
FIG. 4B is a simplified, partial cross-sectional view of the microelectronic device structure shown in FIG. 4A about the line $A_3$-$A_3$ depicted in FIG. 4A.
Figure 4A:
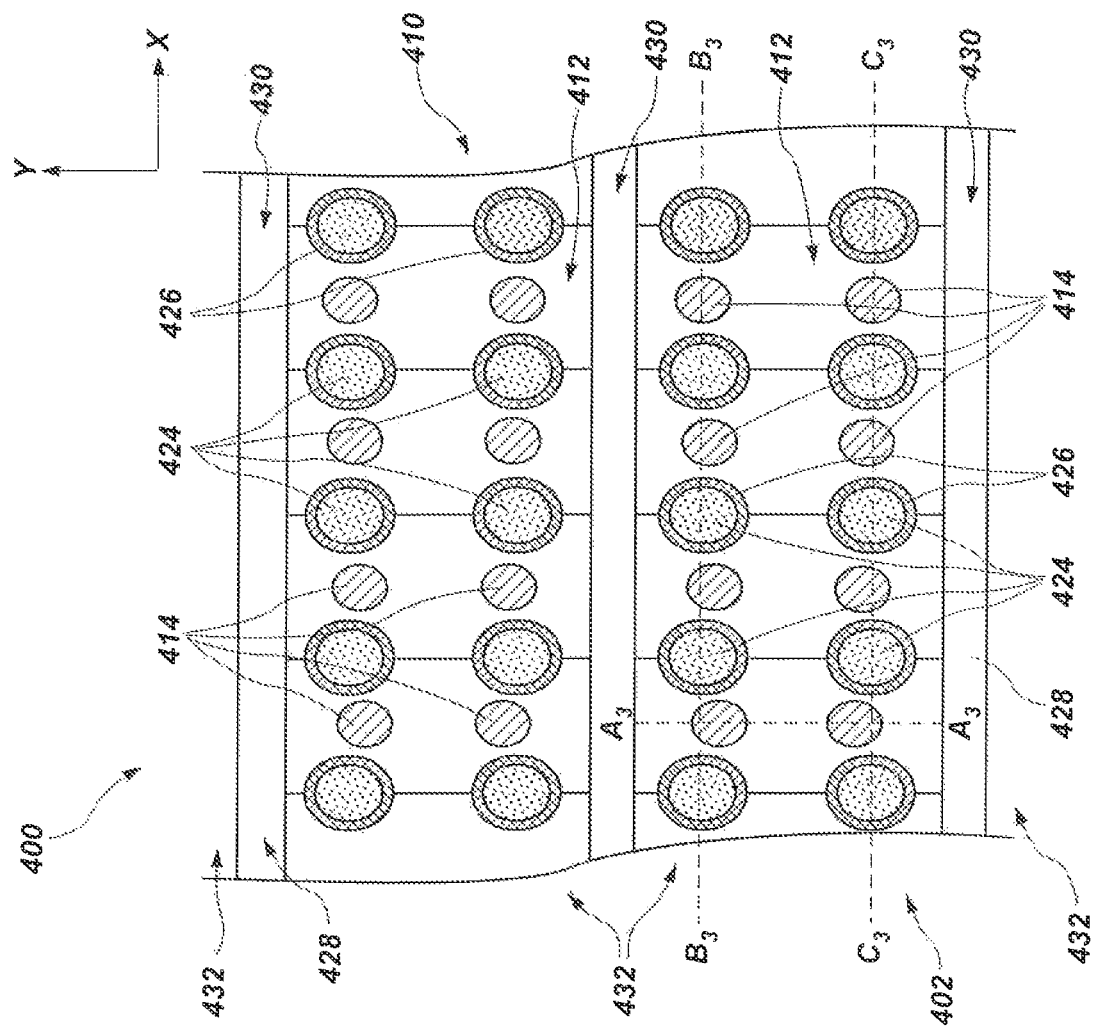
FIG. 4A is a simplified, partial top-down view of a microelectronic device structure, in accordance with further embodiments of the disclosure.

FIG. 4A is a partial, top-down view of a microelectronic device structure 400, in accordance with an embodiment of the disclosure. FIG. 4B is a simplified, partial cross-sectional view of a portion of the microelectronic device structure 400 shown in FIG. 4A about the line A$_2$-A$_2$ depicted in FIG. 4A. For clarity and ease of understanding of the drawings and related description, not all features (e.g., structures, materials, regions) of the microelectronic device structure 400 depicted in one of FIGS. 4A and 4B are depicted the other of FIGS. 4A and 4B. For example, some features of the microelectronic device structure 400 vertically overlying or vertically underlying other features of the microelectronic device structure 400 are not shown in each of FIGS. 4A and 4B so as to provide a clearer view of the other features.

As shown in FIG. 4A, the microelectronic device structure 400 may be substantially similar to the microelectronic device structure 300 (FIG. 3A), except that individual blocks 432 of the microelectronic device structure 400 may include multiple contact structures 414 at the same horizontal position in the X-direction as one another. For example, individual blocks 432 of the microelectronic device structure 400 may include pairs of the contact structures 414 horizontally neighboring one another in the Y-direction. The pairs of contact structures 414 may horizontally alternate in the X-direction with pairs of support structures 424 horizontally neighboring one another in the Y-direction. In addition, horizontal positions in the Y-direction of at least some (e.g., each) of the contact structures 414 associated with the block 432 may be different than horizontal positions in the Y-direction of at least some (e.g., each) other of the contact structures 414 associated with the block 432. For example, the contact structures 414 associated with an individual block 432 may progressively shift from horizontal positions relatively more proximate slots 430 horizontally neighboring the block 432 to other horizontal positions relatively more distal from the slots 430 (e.g., other horizontal positions reality more proximate horizontal centers in the Y-direction of the steps 412 of the block 432). In some embodiments, pairs of contact structures 414 horizontally neighboring one another in the Y-direction and contacting relatively vertically higher steps 412 of an individual block 432 are positioned relatively horizontally closer to slots 430 horizontally neighboring the block 432 than are other pairs of contact structures 414 horizontally neighboring one another in the Y-direction and contacting relatively vertically lower steps 412 of the block 432. In addition, for one or more (e.g., each) of the blocks 432 of the microelectronic device structure 400, the contact structures 414 associated with the block 432 may be substantially horizontally centered in the X-direction on the steps 412 of the block 432. In additional embodiments, for one or more (e.g., each) of the blocks 432 of the microelectronic device structure 400, at least one (e.g., all, less than all) of the contact structures 414 associated with the block 432 is horizontally offset in the X-direction from a horizontal center of the step 412 on which the contact structure 414 is located.

With continued reference to FIG. 4A, at least some (e.g., all) contact structures 414 associated with an individual (e.g., single) block 432 of the microelectronic device structure 400 may be horizontally offset from one another in the Y-direction. For example, horizontal centers of contact structures 414 horizontally neighboring one another in the X-direction within horizontal boundaries of the block 432 (and, hence, on steps 412 at different vertical positions than one another within the block 432) may be offset from one another in the Y-direction, as depicted by the phantom lines B$_2$-B$_2$ and the additional phantom lines C$_3$-C$_3$ horizontally extending in the X-direction in FIG. 4A. In additional embodiments, horizontal centers of at least some (but less than all) contact structures 414 associated with the same block 432 as one another are substantially aligned with one another in the Y-direction. As shown in FIG. 4A, at least two support structures 424 associated with an individual block 432 are substantially aligned in the Y-direction with horizontally neighboring (e.g., in the X-direction) support structures 424 associated with block 432. In addition, at least some (e.g., all, less than all) contact structures 414 horizontally neighboring one another in the Y-direction may be substantially aligned with one another in the X-direction. In addition, referring to FIG. 4B, horizontal centers of contact structures 414 on the same step 412 as one another (and, hence, at the same vertical position in the Z-direction as one another) may each be horizontally offset in the Y-direction from a horizontal center of one or more of the interconnect structure 420 and the pad structure 422 operatively associated therewith (e.g., electrically connected thereto). In some embodiments, the horizontal dimensions (e.g., lengths) of the pad structures 422 are elongated in the Y-direction relative to the horizontal dimensions (e.g., lengths) of the pad structures 222 (FIG. 2B) in the Y-direction to accommodate the horizontal positions in the Y-direction of the contact structures 414.

Figure 5:
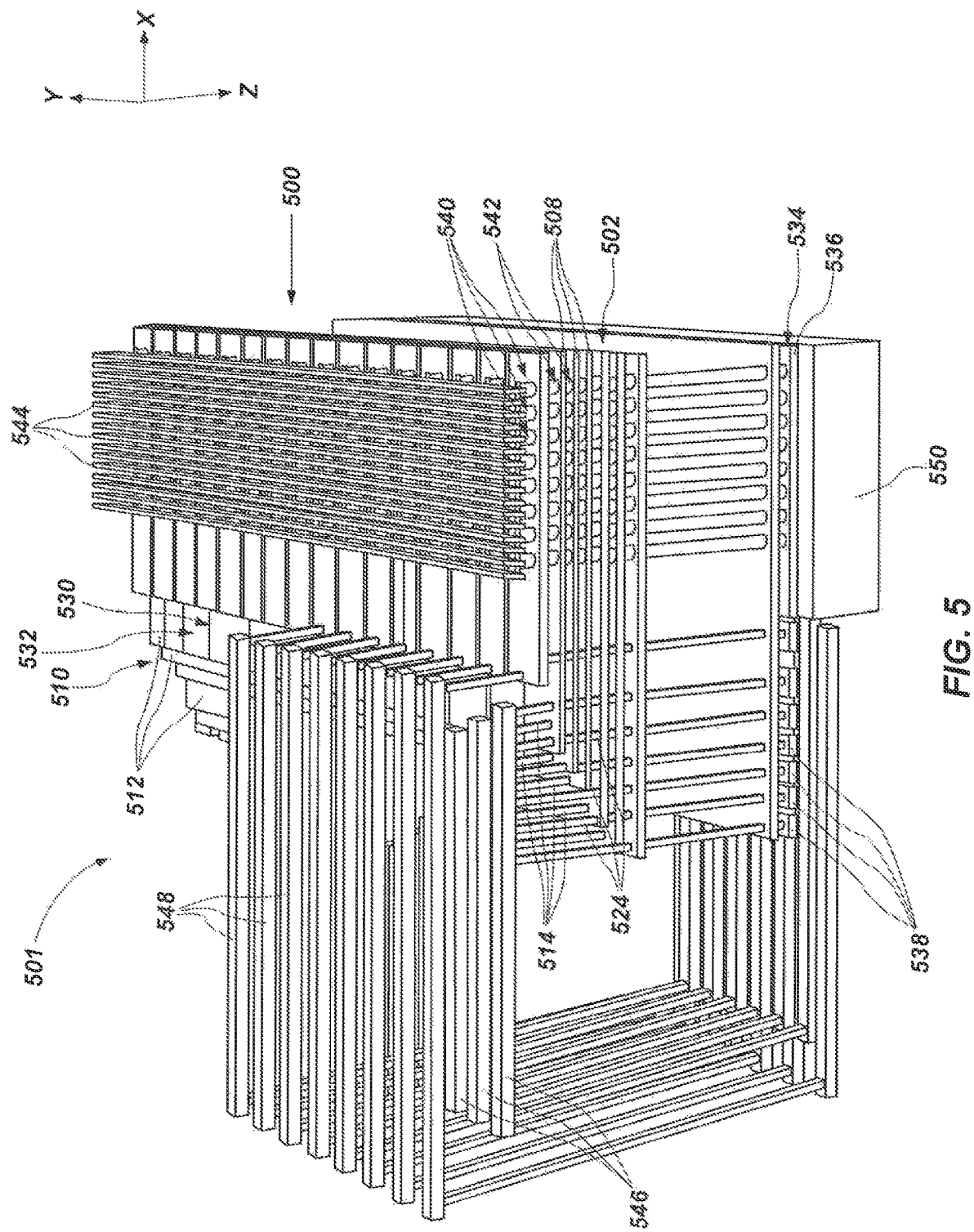
FIG. 5 is a partial cutaway perspective view of a microelectronic device, in accordance with embodiments of the disclosure.

FIG. 5 illustrates a partial cutaway perspective view of a portion of a microelectronic device 501 (e.g., a memory device, such as a dual deck 3D NAND Flash memory device) including a microelectronic device structure 500. The microelectronic device structure 500 may be substantially similar to one of the microelectronic device structures 100, 200, 300, 400 previously described with reference to FIGS. 1 through 4B. For example, as shown in FIG. 5, the microelectronic device structure 500 may include a stack structure 502 including tiers 508 of vertically alternating (e.g., in the Z-direction) conductive structures and insulative structures, and horizontally divided (e.g., in the Y-direction) into multiple blocks 532 horizontally separated (e.g., in the Y-direction) from one another by slots 530; staircase structures 510 having steps 512 defined by edges of the tiers 508; contact structures 514 connected (e.g., physically connected, electrically connected) to the steps 512 of the staircase structures 510; and support structures 524 vertically extending through the stack structure 502.

The microelectronic device 501 further includes a source tier 534 underlying the stack structure 502. The source tier 534 includes a source structure 536 (e.g., a source plate) and discrete conductive structures 538 (e.g., discrete conductive island structures) horizontally separated (e.g., in the X-direction and in the Y-direction (FIG. 2A) perpendicular to the X-direction) from the source structure 536 and from one another. The source structure 536 and the discrete conductive structures 538 may be located at substantially the same vertical position (e.g., in the Z-direction) within the microelectronic device 501 as one another. At least one dielectric material may be horizontally interposed between (e.g., in the X-direction and in the Y-direction) the discrete conductive structures 538 and may also be horizontally interposed between the discrete conductive structures 538 and the source structure 536. Put another way, the dielectric material may horizontally intervene between and separate horizontally neighboring discrete conductive structures 538 of the source tier 534, and may also horizontally intervene between and separate the source structure 536 and the discrete conductive structures 538 of the source tier 534.

The source structure 536 and the discrete conductive structures 538 may each individually be formed of and include at least one electrically conductive material, such as one or more of a metal (e.g., W, Ti, Mo, Nb, V, Hf, Ta, Cr, Zr, Fe, Ru, Os, Co, Rh, Ir, Ni, Pa, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide, a conductively-doped semiconductor material (e.g., conductively-doped Si, conductively-doped Ge, conductively-doped SiGe). In some embodiments, the source structure 536 and the discrete conductive structures 538 have substantially the same material composition as one another. Put another way, the source structure 536 and the discrete conductive structures 538 may be formed of and include the same electrically conductive material as one another. For example, the source structure 536 and the discrete conductive structures 538 may be formed (e.g., substantially simultaneously formed) by patterning (e.g., using a predetermined reticle configuration) the electrically conductive material.

The discrete conductive structures 538 of the source tier 534 may be located vertically below (e.g., in the Z-direction) and in physical contact with the support structures 524 of the microelectronic device structure 500. Accordingly, the discrete conductive structures 538 may be located horizontally proximate (e.g., in the X-direction and the Y-direction) and vertically below (e.g., in the Z-direction) the contact structures 514 on the steps 512 of the stack structure 502 of the microelectronic device structure 500. For example, the discrete conductive structures 538 may individually be positioned horizontally between and vertically below horizontally neighboring contact structures 514. The discrete conductive structures 538 may be located within horizontal boundaries of the staircase structures 510, and, optionally, may also be located outside of the horizontal boundaries of the staircase structures 510 (e.g., some of the discrete conductive structures 538 may be located outside of but proximate to the horizontal boundaries of the staircase structures 510).

The discrete conductive structures 538 may each individually exhibit any desired geometric configuration (e.g., dimensions and shape) and spacing. In some embodiments, one or more (e.g., each) of the discrete conductive structures 538 exhibits a generally quadrilateral (e.g., generally rectangular, generally square) shape. Each of the discrete conductive structures 538 may exhibit substantially the same geometric configuration (e.g., the same dimensions and the same shape) and horizontal spacing (e.g., in the X-direction, in the Y-direction) as each other of the discrete conductive structures 538, or at least some of the discrete conductive structures 538 may exhibit a different geometric configuration (e.g., one or more different dimensions, a different shape) and/or different horizontal spacing than at least some other of the discrete conductive structures 538.

As shown in FIG. 5, the microelectronic device 501 may further include strings 540 of memory cells 542 vertically coupled to each other in series, data lines 544 (e.g., bit lines), access lines 546, and select lines 548. The strings 540 of the memory cells 542 extend vertically and orthogonal to conductive lines and tiers (e.g., the data lines 544, the source tier 534, the tiers 508 of the stack structure 502, the access lines 546, the select lines 548) of the microelectronic device 501, and the contact structures 514 may electrically couple components to each other as shown (e.g., the access lines 546 and the select lines 548 to the tiers 508 of the stack structure 502 of the microelectronic device structure 500).

With continued reference to FIG. 5, the microelectronic device 501 may also include a control unit 550 (e.g., a control device) positioned vertically below the strings 540 of memory cells 542, which may include one or more of string driver circuitry, pass gates, circuitry for selecting gates, circuitry for selecting conductive lines (e.g., the data lines 544, the access lines 546, the select lines 548, additional data lines, additional access lines, additional select lines), circuitry for amplifying signals, and circuitry for sensing signals. In some embodiments, the control unit 550 is at least partially (e.g., substantially) positioned within horizontal boundaries (e.g., in the X-direction and the Y-direction) of a horizontal area occupied by the strings 540 of memory cells 542. The control unit 550 may, for example, be electrically coupled to the data lines 544, the source structure 536 of the source tier 534, the access lines 546, and the select lines 548. In some embodiments, the control unit 550 includes CMOS (complementary metal-oxide-semiconductor) circuitry. In such embodiments, the control unit 550 may be characterized as having a "CMOS under Array" ("CuA") configuration.

Thus, in accordance with embodiments of the disclosure, a microelectronic device comprises a stack structure, at least one staircase structure, contact structures, and support structures. The stack structure comprises vertically alternating conductive structures and insulating structures arranged in tiers, each of the tiers individually comprising one of the conductive structures and one of the insulating structures. The at least one staircase structure is within the stack structure and has steps comprising edges of at least some of the tiers. The contact structures are on the steps of the at least one staircase structure. The support structures horizontally alternate with the contact structures in a first horizontal direction and vertically extend through the stack structure. The support structures have oblong horizontal cross-sectional shapes.

Furthermore, in accordance with additional embodiments of the disclosure, a microelectronic device comprises a stack structure, at least one staircase structure, contact structures, and support structures. The stack structure comprises tiers each comprising at least one conductive structure and at least one insulating structure vertically adjacent the at least one conductive structure. The at least one staircase structure has steps comprising horizontal ends of at least some of the tiers. The contact structures are in physical contact with the steps of the staircase structure. At least some of the contact structures are horizontally offset from one another in a first direction. The support structures are horizontally interposed between the contact structures in a second direction orthogonal to the first direction and vertically extend through the stack structure.

Moreover, in accordance with further embodiments of the disclosure, a memory device comprises a stack structure, a staircase structure, a source tier, contact structures, support structures, data lines, an array of vertically extending strings of memory cells, conductive lines, and a control device. The stack structure comprises vertically alternating conductive structures and insulating structures arranged in tiers, each of the tiers individually comprising at least one of the conductive structures and at least one of the insulating structures. The staircase structure has steps comprising edges of at least some of the tiers of the stack structure. The source tier underlies the stack structure and comprises a source plate, and discrete conductive structures horizontally separated from one another and the source plate by a dielectric material. The contact structures are on the steps of the staircase structure. The support structures are horizontally between the contact structures and vertically extend through the stack structure to the discrete conductive structures of the source tier. The data lines overly the stack structure. The array of vertically extending strings of memory cells extend through the stack structure and are electrically connected to the source plate and the data lines. The conductive lines are electrically connected to the contact structures. The control device vertically underlies the source tier and is within horizontal boundaries of the array of vertically extending strings of memory cells, the control device electrically coupled to the source plate, the data lines, and the conductive lines.

Figure 6:
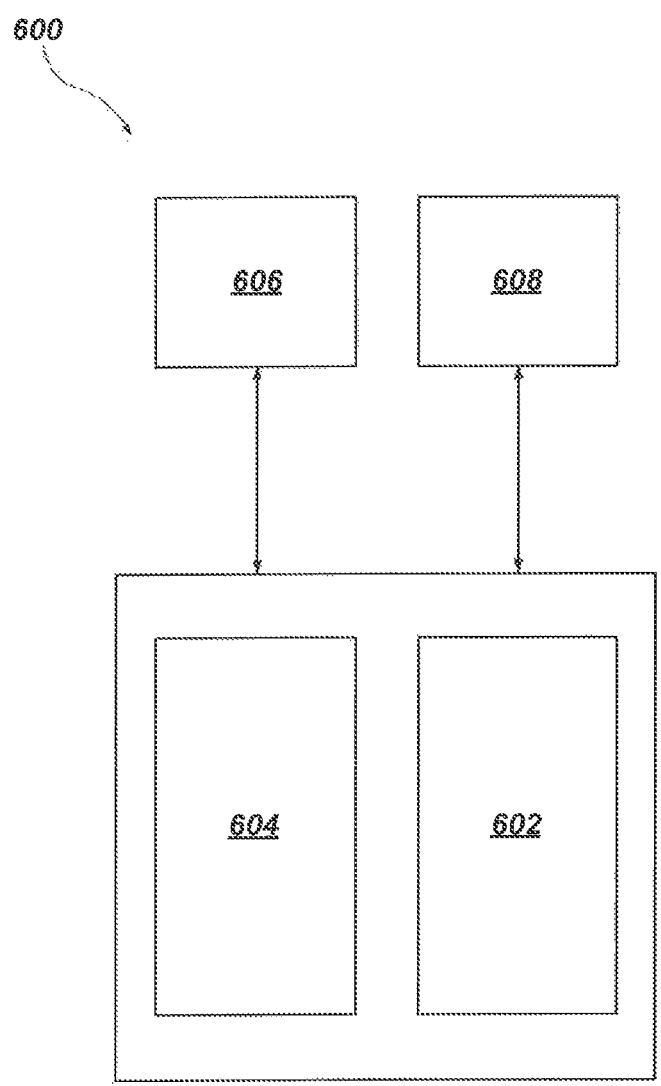
FIG. 6 is a schematic block diagram illustrating an electronic system, in accordance with embodiments of the disclosure.

Microelectronic device structures (e.g., the microelectronic device structures 100, 200, 300, 400 previously described with reference to FIGS. 1 through 4B) and microelectronic devices (e.g., the microelectronic device 501 previously described with reference to FIG. 5) in accordance with embodiments of the disclosure may be used in embodiments of electronic systems of the disclosure. For example, FIG. 6 is a block diagram of an illustrative electronic system 600 according to embodiments of disclosure. The electronic system 600 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPad® or SURFACE® tablet, an electronic book, a navigation device, etc. The electronic system 600 includes at least one memory device 602. The memory device 602 may comprise, for example, an embodiment of one or more of a microelectronic device structure (e.g., at least one of the microelectronic device structures 100, 200, 300, 400 previously described with reference to FIGS. 1 through 4B) and a microelectronic device (e.g., the microelectronic device 501 previously described with reference to FIG. 5) previously described herein. The electronic system 600 may further include at least one electronic signal processor device 604 (often referred to as a "microprocessor"). The electronic signal processor device 604 may, optionally, include an embodiment of one or more of a microelectronic device structure (e.g., at least one of the microelectronic device structures 100, 200, 300, 400 previously described with reference to FIGS. 1 through 4B) and a microelectronic device (e.g., the microelectronic device 501 previously described with reference to FIG. 5). While the memory device 602 and the electronic signal processor device 604 are depicted as two (2) separate devices in FIG. 6, in additional embodiments, a single (e.g., only one) memory/processor device having the functionalities of the memory device 602 and the electronic signal processor device 604 is included in the electronic system 600. In such embodiments, the memory/processor device may include one or more of a microelectronic device structure (e.g., at least one of the microelectronic device structures 100, 200, 300, 400 previously described with reference to FIGS. 1 through 4B) and a microelectronic device (e.g., the microelectronic device 501 previously described with reference to FIG. 5) previously described herein. The electronic system 600 may further include one or more input devices 606 for inputting information into the electronic system 600 by a user, such as, for example, a mouse or other pointing device, a keyboard, a touchpad, a button, or a control panel. The electronic system 600 may further include one or more output devices 608 for outputting information (e.g., visual or audio output) to a user such as, for example, one or more of a monitor, a display, a printer, an audio output jack, and a speaker. In some embodiments, the input device 606 and the output device 608 may comprise a single touchscreen device that can be used both to input information to the electronic system 600 and to output visual information to a user. The input device 606 and the output device 608 may communicate electrically with one or more of the memory device 602 and the electronic signal processor device 604.

Thus, in accordance with embodiments of the disclosure, an electronic system comprises an input device, an output device, a processor device operably coupled to the input device and the output device, and a memory device operably coupled to the processor device. The memory device comprises at least one microelectronic device structure comprising a stack structure comprising tiers each comprising an electrically conductive structure and a dielectric structure vertically neighboring the electrically conductive structure; a staircase structure within the stack structure and exhibiting steps comprising edges of at least some of the tiers; a source tier vertically below the stack structure and comprising: a source structure, and discrete conductive structures electrically isolated from one another and the source structure; conductive contact structures on the steps of the staircase structure; and conductive support pillars having oblong horizontal cross-sectional shapes horizontally alternating with the conductive contact structures and vertically extending through the stack structure at the staircase structure to the discrete conductive structures of the source tier.

The structures (e.g., the microelectronic device structures 100, 200, 300, 400), devices (e.g., the microelectronic device 501), and systems (e.g., the electronic device 600) of the disclosure advantageously facilitate one or more of improved performance, reliability, and durability, lower costs, increased miniaturization of components, improved pattern quality, and greater packaging density as compared to conventional structures, conventional devices, and conventional systems. By way of non-limiting example, the configurations of the contact structures (e.g., the contact structures 114, 214, 314, 414 of the disclosure previously described with reference to FIGS. 1 through 4B) and the support structures (e.g., the support structures 124, 224, 324, 424) of the disclosure may reduce the risk of undesirable word line deformations (e.g., bending, warping, bowing), undesirable word line damage (e.g., word line contact punch through), and undesirable word line current leakage as compared to conventional contact structure configurations and support structure configurations.

While the disclosure is susceptible to various modifications and alternative forms, specific embodiments have been shown by way of example in the drawings and have been described in detail herein. However, the disclosure is not limited to the particular forms disclosed. Rather, the disclosure is to cover all modifications, equivalents, and alternatives falling within the scope of the following appended claims and their legal equivalents.

What is claimed is:

1. A microelectronic device, comprising:
   a stack structure comprising vertically alternating conductive structures and insulating structures arranged in tiers, each of the tiers individually comprising one of the conductive structures and one of the insulating structures;
   a staircase structure within the stack structure and having steps comprising edges of at least some of the tiers;
   contact structures on the steps of the staircase structure; and
   support structures horizontally alternating with the contact structures in a first horizontal direction and vertically extending through the stack structure, the support structures having oblong horizontal cross-sectional shapes.

2. The microelectronic device of claim 1, wherein horizontal centers of the support structures are substantially aligned with a horizontal centerline of the staircase structure extending in the first horizontal direction.

3. The microelectronic device of claim 1, wherein horizontal centers of the support structures are substantially horizontally aligned with horizontal centers the contact structures in a second horizontal direction orthogonal to the first horizontal direction.

4. The microelectronic device of claim 1, wherein each of the support structures has a length in a second horizontal direction orthogonal to the first horizontal direction extending across a majority of a length of the steps of the staircase structure in the second horizontal direction.

5. The microelectronic device of claim 1, wherein the contact structures and the support structures comprise at least one electrically conductive material.

6. The microelectronic device of claim 1, wherein the stack structure is divided into blocks separated from one another by slots filled with dielectric material.

7. The microelectronic device of claim 1, further comprising a source tier underlying the stack structure and comprising:
   a source structure; and
   discrete conductive structures in physical contact with the support structures, the discrete conductive structures horizontally separated from one another and the source structure.

8. The microelectronic device of claim 7, wherein the source structure is electronically isolated from each of the discrete conductive structures.

9. The microelectronic device of claim 1, wherein the conductive structures of the stack structure comprise at least one metal.

* * * * *